(12) United States Patent  
Kuniya

(10) Patent No.: US 8,399,322 B2  
(45) Date of Patent: *Mar. 19, 2013

(54) NON-VOLATILE SEMICONDUCTOR MEMORY DEVICE AND METHOD OF MANUFACTURING THE SAME

(75) Inventor: Takuji Kuniya, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/189,977

(22) Filed: Jul. 25, 2011

(65) Prior Publication Data

US 2011/0278658 A1    Nov. 17, 2011

Related U.S. Application Data

(62) Division of application No. 12/119,981, filed on May 13, 2008, now Pat. No. 8,008,149.

(30) Foreign Application Priority Data

May 14, 2007    (JP) .................................. 2007-127615

(51) Int. Cl.
*H01L 21/336* (2006.01)
(52) U.S. Cl. ........ 438/257; 438/201; 438/211; 438/266; 257/314; 257/315; 257/322
(58) Field of Classification Search .......... 257/314–322; 438/201, 211, 257, 266, 260, 262–264, 594
See application file for complete search history.

(56) References Cited

U.S. PATENT DOCUMENTS

| | | | | |
|---|---|---|---|---|
| 6,515,329 B2 * | 2/2003 | Lee et al. | | 257/315 |
| 6,627,529 B2 * | 9/2003 | Ireland | | 438/619 |
| 6,724,036 B1 * | 4/2004 | Hsieh et al. | | 257/316 |
| 6,744,096 B2 * | 6/2004 | Lee et al. | | 257/316 |
| 6,924,199 B2 * | 8/2005 | Chu et al. | | 438/296 |
| 7,041,555 B2 * | 5/2006 | Ahn et al. | | 438/257 |
| 7,638,850 B2 * | 12/2009 | Lusky et al. | | 257/390 |
| 7,704,851 B2 * | 4/2010 | Kim | | 438/422 |
| 7,737,483 B2 * | 6/2010 | Higashitani | | 257/314 |
| 7,868,376 B2 * | 1/2011 | Aoyama et al. | | 257/324 |
| 8,008,704 B2 * | 8/2011 | Nitta | | 257/315 |
| 8,022,464 B2 * | 9/2011 | Sato et al. | | 257/316 |

(Continued)

FOREIGN PATENT DOCUMENTS

| | | |
|---|---|---|
| JP | 2000-100976 | 4/2000 |
| JP | 2004-172488 | 6/2004 |

(Continued)

OTHER PUBLICATIONS

Daewoong Kang, et al., "Improving the Cell Characteristics Using Low-k Gate Spacer in 1Gb NAND Flash Memory", 2006 IEEE Dig., pp. 1001-1004, Dec. 2006.

*Primary Examiner* — Fernando L Toledo
*Assistant Examiner* — Mohammed Shamsuzzaman
(74) *Attorney, Agent, or Firm* — Oblon, Spivak, McClelland, Maier & Neustadt, L.L.P.

(57) ABSTRACT

A non-volatile semiconductor memory device comprises a plurality of memory cells, each including a semiconductor substrate, a first insulating film formed on the semiconductor substrate, a floating gate formed on the semiconductor substrate with the inclusion of the first insulating film, a second insulating film formed on the floating gate, and a control gate formed on the floating gate with the inclusion of the second insulating film; an element isolation insulating film formed in the semiconductor substrate and extending in a gate-length direction to isolate between memory cells adjoining in a gate-width direction; and an air gap formed on the element isolation insulating film and between floating gates adjoining in the gate-width direction.

11 Claims, 15 Drawing Sheets

U.S. PATENT DOCUMENTS

| | | | |
|---|---|---|---|
| 8,093,114 B2 * | 1/2012 | Xiao et al. | 438/176 |
| 2004/0095797 A1 * | 5/2004 | Yuan et al. | 365/145 |
| 2005/0201154 A1 * | 9/2005 | Yuan et al. | 365/185.14 |
| 2006/0001073 A1 * | 1/2006 | Chen et al. | 257/314 |
| 2006/0076611 A1 | 4/2006 | Matsui et al. | |
| 2006/0194390 A1 | 8/2006 | Imai et al. | |
| 2007/0057315 A1 * | 3/2007 | Matsui et al. | 257/316 |
| 2007/0096202 A1 | 5/2007 | Kang et al. | |
| 2007/0161191 A1 * | 7/2007 | Yuan et al. | 438/257 |
| 2007/0184615 A1 | 8/2007 | Brazzelli et al. | |
| 2007/0212874 A1 * | 9/2007 | Sandhu | 438/637 |
| 2007/0257305 A1 * | 11/2007 | Sasago et al. | 257/316 |
| 2008/0217674 A1 * | 9/2008 | Watanabe | 257/316 |
| 2009/0075471 A1 * | 3/2009 | Imai et al. | 438/622 |
| 2009/0212352 A1 * | 8/2009 | Aoyama et al. | 257/324 |
| 2009/0261446 A1 * | 10/2009 | Gogoi | 257/500 |
| 2010/0230741 A1 * | 9/2010 | Choi et al. | 257/324 |
| 2010/0295113 A1 * | 11/2010 | Kang et al. | 257/316 |
| 2011/0097862 A1 * | 4/2011 | Watanabe | 438/264 |
| 2011/0163367 A1 * | 7/2011 | Kang et al. | 257/316 |
| 2011/0300703 A1 * | 12/2011 | Sato et al. | 438/593 |
| 2012/0049245 A1 * | 3/2012 | Bicksler et al. | 257/202 |
| 2012/0064707 A1 * | 3/2012 | Yang et al. | 438/588 |
| 2012/0074484 A1 * | 3/2012 | Kang et al. | 257/316 |
| 2012/0225547 A1 * | 9/2012 | Lee | 438/594 |

FOREIGN PATENT DOCUMENTS

| | | |
|---|---|---|
| JP | 2004-349549 | 12/2004 |
| JP | 2004-349650 | 12/2004 |
| JP | 2007-67043 | 3/2007 |

* cited by examiner

FIG. 25A
(PRIOR ART)
FIG. 25B
(PRIOR ART)
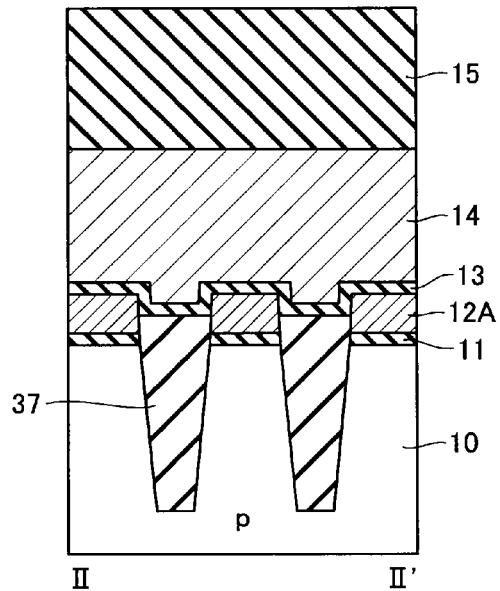
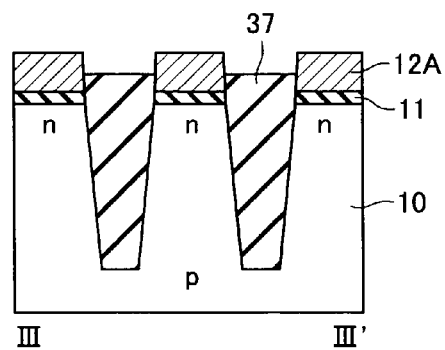
FIG. 26
(PRIOR ART)
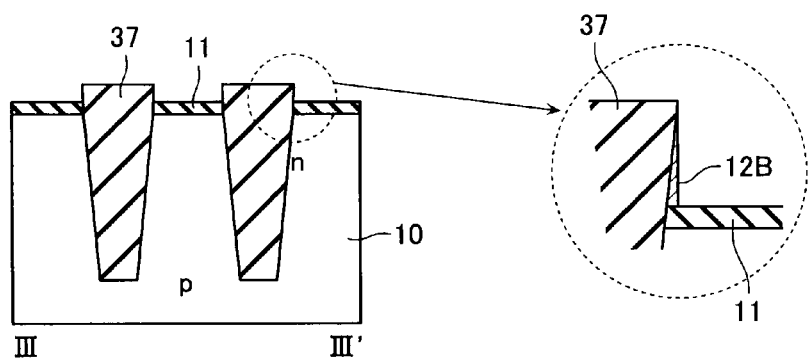

NON-VOLATILE SEMICONDUCTOR MEMORY DEVICE AND METHOD OF MANUFACTURING THE SAME

CROSS-REFERENCE TO RELATED APPLICATION

This application is a division of and claims the benefit of priority under 35 U.S.C. §120 from U.S. Ser. No. 12/119,981 filed May 13, 2008, and claims the benefit of prior under 35 U.S.C. §119 from Japanese Patent Application No. 2007-127615 filed May 14, 2007, the entire contents of each of which are incorporated herein by reference.

BACKGROUND OF THE INVENTION

1. Field of the Invention

The present invention relates to a non-volatile semiconductor memory device with element isolation trenches formed to provide isolation between elements and method of manufacturing the same.

2. Description of the Related Art

Non-volatile semiconductor memory devices include electrically erasable programmable EEPROMs as known. In general, an EEPROM comprises memory cells each including a MOS transistor with a stacked-gate structure of a floating gate serving as a charge accumulation layer and a control gate stacked.

Most suitable one for achieving large capacity among the EEPROMs is an NAND-type EEPROM. The NAND-type EEPROM comprises plural memory cells serially connected such that adjacent ones share a source/drain diffused layer, thereby configuring an NAND cell unit. Plural such NAND cell units are arrayed to configure an NAND cell array. Both ends of each NAND cell unit are connected via respective selection gate transistors to a bit line and a common source line.

Floating gates are separated from each other on a memory cell basis while control gates are continuously patterned as a word line (control gate line) common to memory cells arranged in one direction. Gate electrodes on the selection gate transistors are similarly arranged as a selection gate line in parallel with the word line. The selection gate transistor on the drain side in the NAND cell unit has a diffused layer, which is connected to a bit line arranged to cross the word line. The selection gate transistor on the source side in the NAND cell unit has a diffused layer, which is connected to a common source line.

Such the EEPROM causes a problem associated with interference between floating gates due to capacitive coupling between cells as memory cells are integrated at a higher density. A technology of reducing the interference between floating gates has been known in an NAND flash memory that includes a low-permittivity oxide or an air gap formed between floating gates in plural memory cells serially connected to configure an NAND cell unit. (Daewoong Kang et al., "Improving the Cell Characteristics Using Low-k Gate Spacer in 1 Gb NAND Flash Memory", 2006 IEDM Dig., pp. 1001-1004, December 2006.)

SUMMARY OF THE INVENTION

An aspect of the present invention provides a non-volatile semiconductor memory device, comprising: a plurality of memory cells, each including a semiconductor substrate, a first insulating film formed on the semiconductor substrate, a floating gate formed on the semiconductor substrate with the inclusion of the first insulating film, a second insulating film formed on the floating gate, and a control gate formed on the floating gate with the inclusion of the second insulating film; an element isolation insulating film formed in the semiconductor substrate and extending in a gate-length direction to isolate between memory cells adjoining in a gate-width direction; and an air gap formed on the element isolation insulating film and between floating gates adjoining in the gate-width direction.

Another aspect of the present invention provides a non-volatile semiconductor memory device, comprising: a memory cell array having a plurality of memory cell columns, which are arranged into a matrix on a semiconductor substrate, each having a plurality of memory cells, which are arranged in a first direction, each having a stacked-gate structure of a floating gate and a control gate stacked with a insulating layer disposed therebetween, the control gate extending in a second direction orthogonal to the first direction to form a word line which is commonly used by a plurality of memory cells adjoining in the second direction; and a shallow trench isolation formed in the semiconductor substrate and extending in the first direction to isolate between a plurality of memory cells adjoining in the second direction each other, wherein an air gap is formed in a crossing portion of the word line and the shallow trench isolation and between the word line and the shallow trench isolation.

Yet another aspect of the present invention provides a method of manufacturing a non-volatile semiconductor memory device, comprising: forming a first insulating film on a semiconductor substrate; forming on the first insulating film a first electrode layer to be turned into a floating gate; forming an element isolation trench extending from the first electrode layer into the semiconductor substrate to define an element forming region in the semiconductor substrate; forming a buried film in the element isolation trench in the semiconductor substrate; forming a second insulating film on the first electrode layer and the buried film; forming on the second insulating film a second electrode layer to be turned into a control gate; selectively removing the second electrode layer to form said control gate crossing the element forming region and the element isolation trench; selectively removing the second insulating film in a region not covered with the control gate; selectively removing an upper layer of the buried film after selectively removing the second insulating film; and selectively removing the first electrode layer in a region not covered with the control gate to form the floating gate.

BRIEF DESCRIPTION OF THE DRAWINGS

FIGS. 25A and 25B are cross-sectional views for illustrating a problem associated with an NAND-type EEPROM of the prior art.

FIG. 26 is a cross-sectional view for illustrating the problem associated with the NAND-type EEPROM of the prior art.

DETAILED DESCRIPTION OF THE EMBODIMENTS

The embodiments of the invention will now be described with reference to the drawings.

First Embodiment Structure

Figure 1:
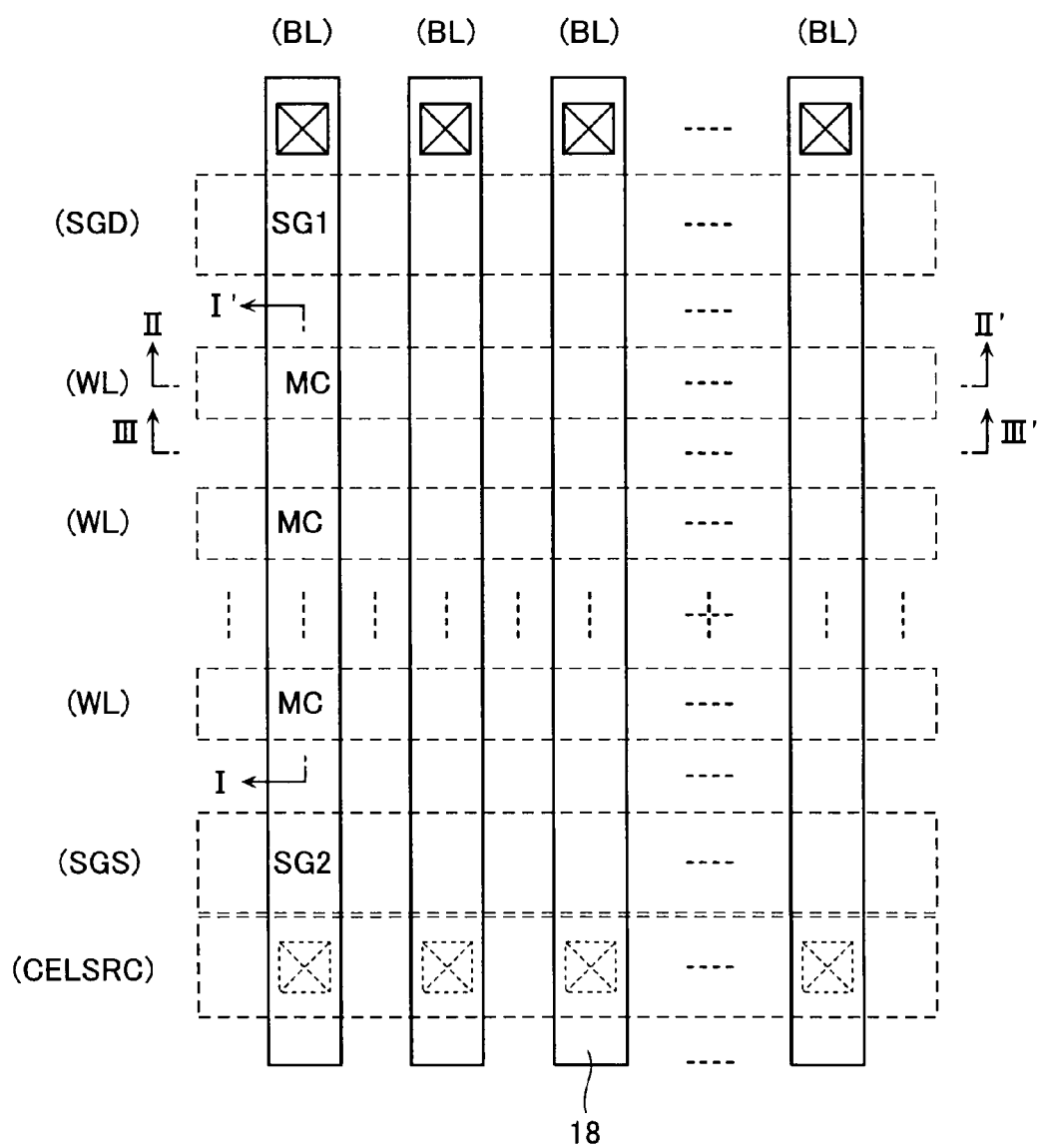
FIG. 1 is a plan view of a cell region in an NAND-type EEPROM (non-volatile semiconductor memory device) according to a first embodiment of the present invention.

FIG. 1 is a plan view of a cell region in an NAND-type EEPROM (non-volatile semiconductor memory device) according to a first embodiment of the present invention.

In the cell region there are formed plural bit lines BL extending in the longitudinal direction in the figure. In a lower layer than the bit lines BL there are formed selection gates SGD, SGS and a common source line CELSRC laterally extending and crossing the bit lines BL at right angles. In addition, there are formed plural word lines WL sandwiched between the selection gates SGD, SGS and extending in parallel with the selection gates SGD, SGS.

A plurality of memory cells MC are formed beneath each of intersections of the plurality of word lines WL and bit lines BL, and selection gate transistors SG1, SG2 are formed beneath each of intersections of the selection gates SGD, SGS and the bit lines BL.

Here a plurality of memory cells MC are serially connected in a direction of the bit lines BL to form a memory cell column (a NAND cell unit). Both ends of the memory cell column are connected via respective selection gate transistors SG1 and SG2 to a bit line BL and a common source line CELSRC. As shown in FIG. 1, these memory cell columns are arranged in a direction of the word line WL to form a memory cell block (a NAND block). In addition, though it is not shown, plural memory cell columns are generally arranged into a matrix to form a memory cell array.

Figure 2:
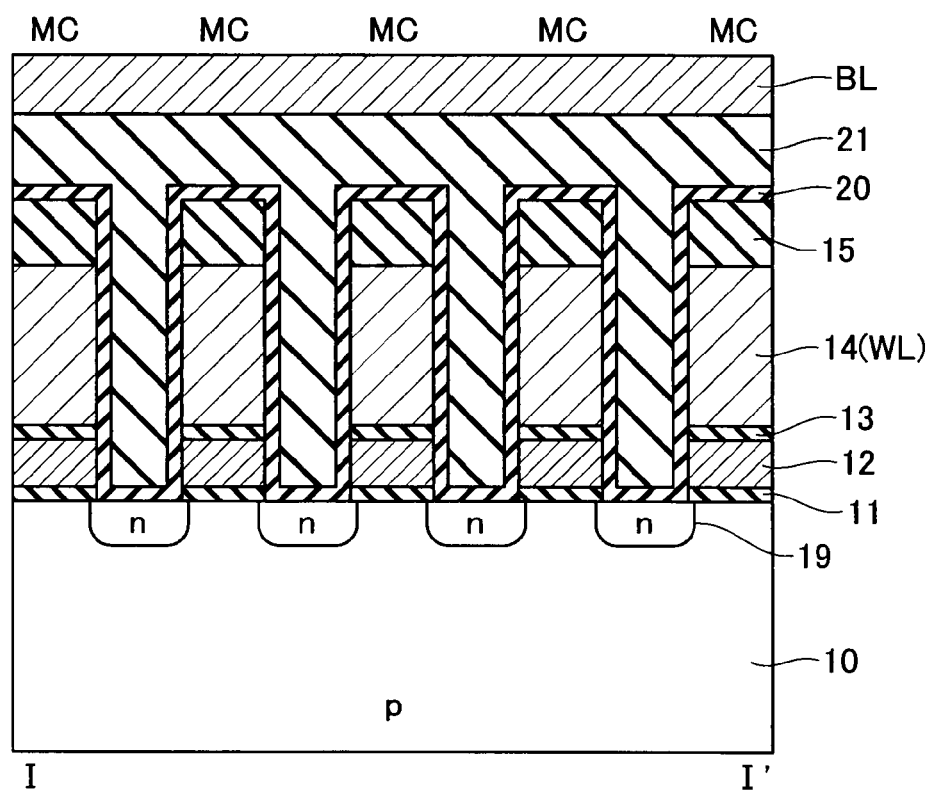
FIG. 2 is a cross-sectional view taken along I-I' line in FIG. 1.
Figure 3:
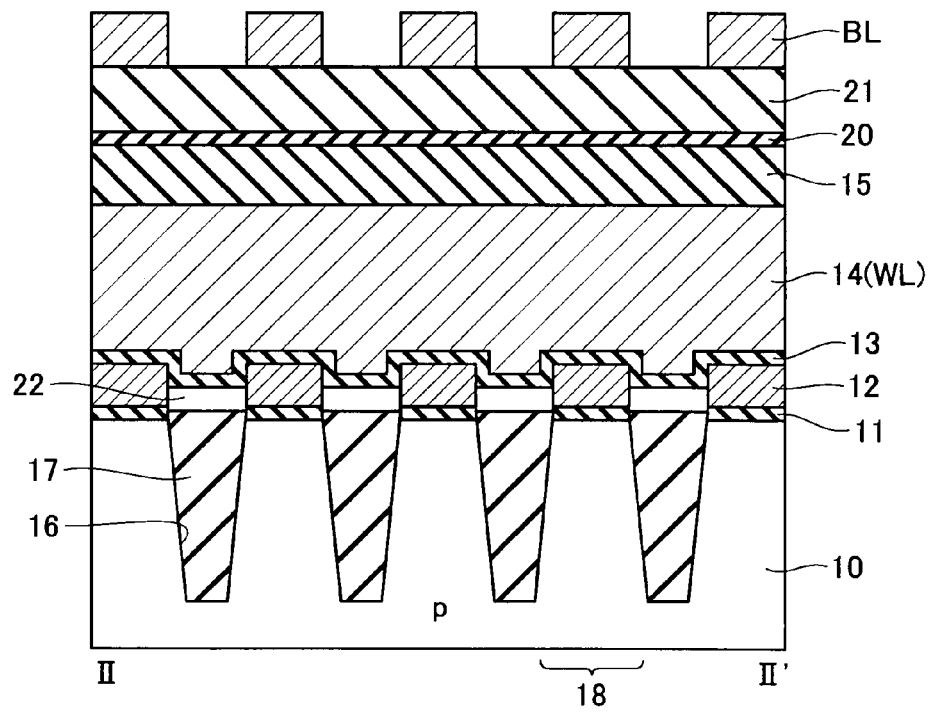
FIG. 3 is a cross-sectional view taken along II-II' line in FIG. 1.
Figure 4:
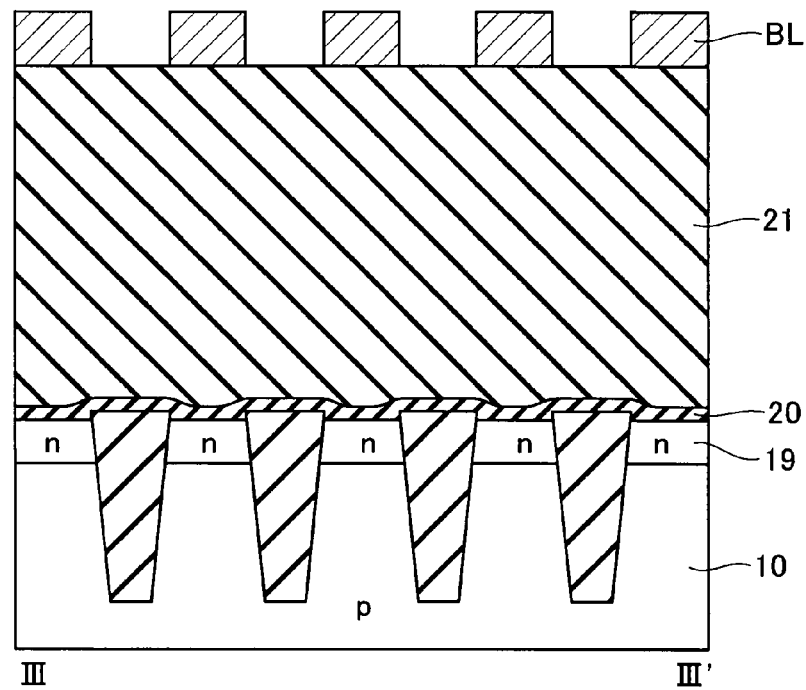
FIG. 4 is a cross-sectional view taken along III-III' line in FIG. 1.

FIG. 2 is a cross-sectional view of the NAND-type EEPROM according to the present embodiment taken along the bit line BL (I-I' section of FIG. 1). FIG. 3 is a cross-sectional view taken along the word line WL (II-II' section of FIG. 1). FIG. 4 is a cross-sectional view of a portion between adjacent word lines in parallel with the word line WL (III-III' section of FIG. 1).

As shown in FIGS. 2-4, on a p-type silicon substrate 10, for example, a first insulating film or gate oxide film (tunneling oxide film) 11, a floating gate 12 composed of polysilicon film, a second insulating film or intergate insulating film 13, a control gate 14 composed of polysilicon film, and a silicon nitride film 15 are stacked in this order to configure memory cells MC together with the silicon substrate 10.

The floating gates 12 are separated from each other on a memory cell MC basis. The control gates 14 are continuously formed in the direction orthogonal to the bit line BL as word lines WL or selection gates SGD, SGS common to plural memory cells MC or selection gate transistors SG1, SG2 arranged in the direction orthogonal to the bit line BL. Although not shown in the figure, a short circuit is made in the selection gate transistor SG1, SG2 between the floating gate 12 and the control gate 14 to configure a usual transistor.

In a region between the bit line BL and the bit line BL in an upper layer of the silicon substrate 10, element isolation trenches 16 are formed extending in the direction of the bit line BL (a gate-length direction), self-aligned with the floating gates 12. An element isolation insulating film (STI (Shallow Trench Isolation)) 17 is buried in the element isolation trench 16. Thus, in the upper layer of the silicon substrate 10, element forming regions 18 are defined in the form of stripes isolated from each other in the word line WL direction (a gate-width direction).

An upper layer of the element forming region 18 has a portion facing the floating gate 12 via the gate oxide film 11, in which a channel region in the memory cell MC is formed. Between such channel regions there is formed an n-type impurity-diffused region 19 serving as a drain/source shared by adjacent memory cells MC.

A stacked body of electrodes including the gate oxide film 11, the floating gate 12, the intergate insulating film 13, the control gate 14 and the silicon nitride film 15, and the upper surface of the silicon substrate 10 between such stacked bodies are covered with a thin silicon nitride film 20. In addition, an interlayer insulating film 21 such as TEOS (tetraethoxysilane) is formed thereon. The interlayer insulating film 21 fills spaces between the stacked bodies of electrodes. The bit lines BL are selectively formed on the interlayer insulating film 21.

An air gap 22 is formed between the intergate insulating film 13 and the element isolation insulating film 17. The position of the air gap 22 in the height corresponds to the position of the floating gate 12 to be formed.

With this configuration, the interposition of the air gap 22 between the floating gates 12 adjoining in the word line WL direction makes it possible to reduce the capacitive coupling between memory cells MC to suppress the interference between floating gates (Yupin effect). Desirably, the air gap 22 ensures a height of t/3 or more in order to reduce the capacitive coupling where t denotes a thickness of the floating gate 12.

First Embodiment Method of Manufacturing

With reference to FIGS. 5-24, a method of manufacturing the NAND-type EEPROM according to the above first embodiment is described next.

Figure 5:
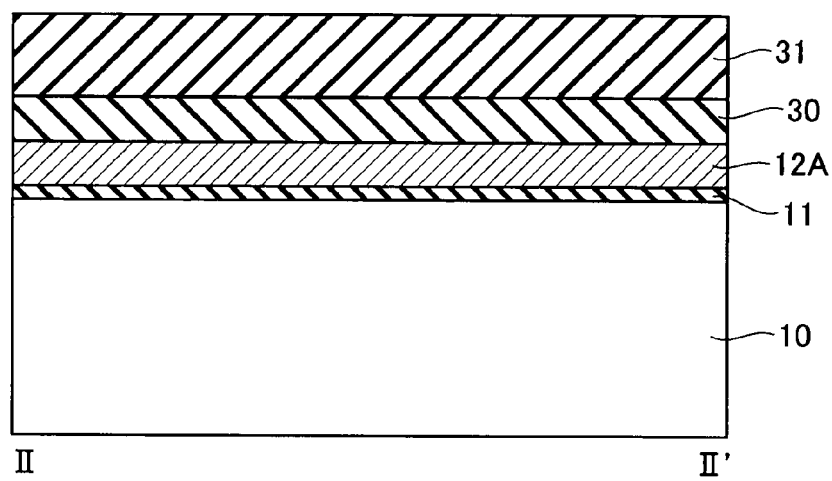
FIG. 5 is a cross-sectional view showing the NAND-type EEPROM in order of process step.
Figure 6:
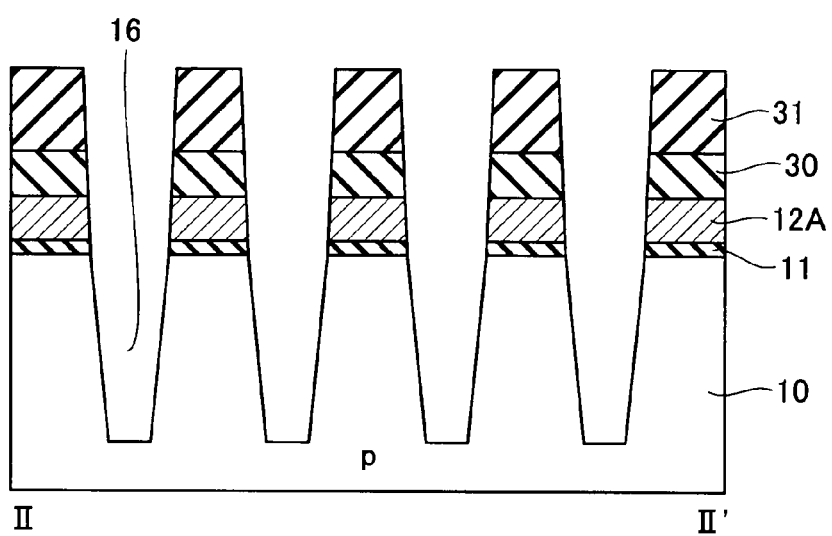
FIG. 6 is a cross-sectional view showing the NAND-type EEPROM in order of process step.

First, as shown in FIG. 5, the gate oxide 11 is formed with a thickness of, for example, 10 nm on a memory cell region of the silicon substrate 10. A first polysilicon film 12A to be turned into the floating gate 12 is formed with a thickness of, for example, 100 nm on the gate oxide film 11. Further, a silicon nitride 30 is formed with a thickness of, for example, 50 nm on the first polysilicon film 12A. Then, a resist film 31 is formed on the silicon nitride 30. The resist film 31 is patterned as shown in FIG. 6 to selectively remove the silicon nitride 30, the first polysilicon film 12A, the gate oxide film 11 and an upper layer of the silicon substrate 10 by anisotropic etching to form the element isolation trenches 16.

Figure 7:
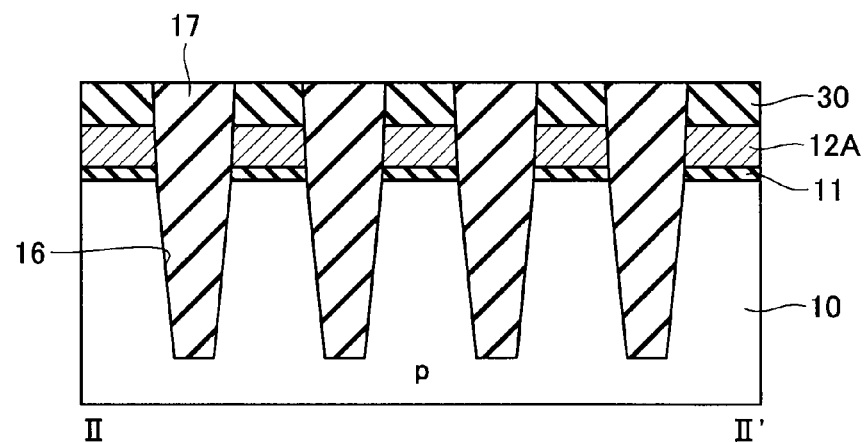
FIG. 7 is a cross-sectional view showing the NAND-type EEPROM in order of process step.

Subsequently, as shown in FIG. 7, after removal of the resist film 31, a first buried film or the element isolation insulating film 17 such as STI-TEOS film or the like is formed over the entire surface. Then, with a stopper of the silicon nitride 30, a process of CMP (Chemical Mechanical Polishing) is applied to planarize the upper surface of the element isolation insulating film 17.

Figure 8:
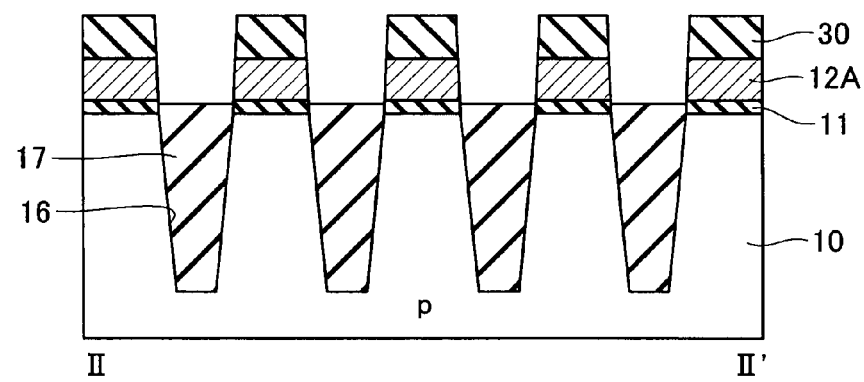
FIG. 8 is a cross-sectional view showing the NAND-type EEPROM in order of process step.

Next, as shown in FIG. 8, with a mask of the silicon nitride 30, a process of wet etching using DHF (Dilute Hydrofluoric Acid) or RIE (Reactive Ion Etching) is used to recess the upper surface of the element isolation insulating film 17 back to a certain height.

Figure 9:
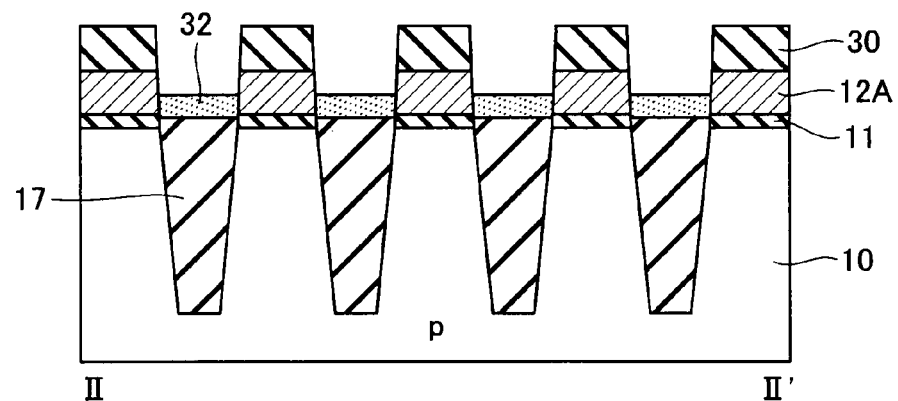
FIG. 9 is a cross-sectional view showing the NAND-type EEPROM in order of process step.

Thereafter, as shown in FIG. 9, an air-gap creation film 32 composed of a material with a larger etching rate than the element isolation insulating film 17, such as a polysilazan oxide, is formed over the element isolation insulating film 17 through the similar method to that for the element isolation insulating film 17. It is then recessed back to form a second buried film with a thickness corresponding to the height of the air gap 22.

Figure 10:
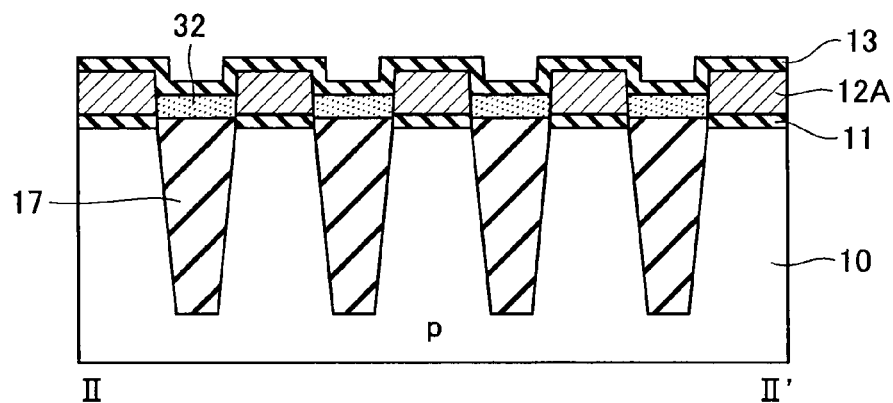
FIG. 10 is a cross-sectional view showing the NAND-type EEPROM in order of process step.

Then, as shown in FIG. 10, after the silicon nitride 30 is removed by etching and then a native oxide film on the first polysilicon film 12A is removed by wet etching, the intergate insulating film 13 of ONO (SiO2—SiN—SiO2) or the like is formed over the entire surface.

Figure 11:
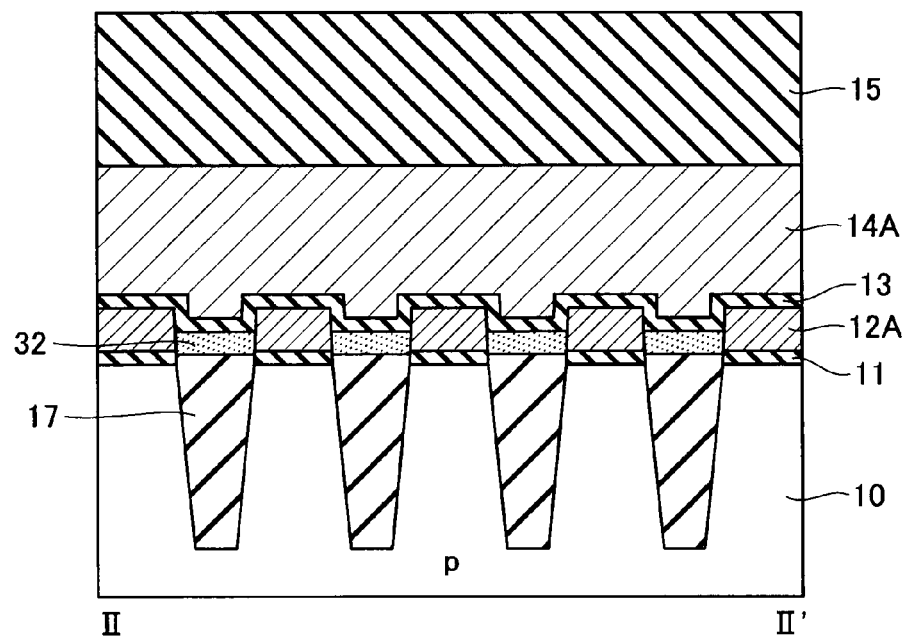
FIG. 11 is a cross-sectional view showing the NAND-type EEPROM in order of process step.
Figure 12:
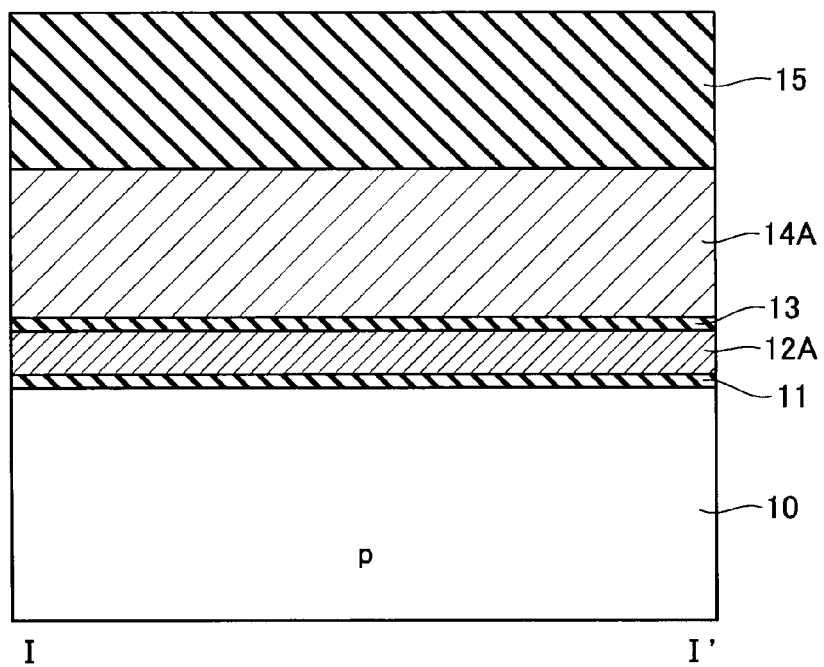
FIG. 12 is a cross-sectional view showing the NAND-type EEPROM in order of process step.

Thereafter, as shown in FIGS. 11 and 12, a second polysilicon film 14A to be turned into the control gate 14 is formed with a thickness of, for example, 200 nm on the intergate insulating film 13. Then, the silicon nitride film 15 is formed with a thickness of, for example, around 150 nm on the second polysilicon film.

Figure 13:
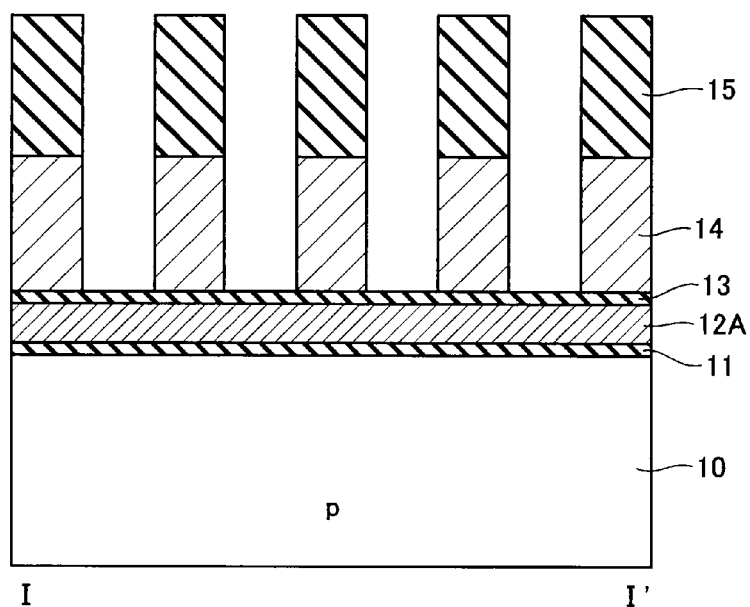
FIG. 13 is a cross-sectional view showing the NAND-type EEPROM in order of process step.
Figure 14A:
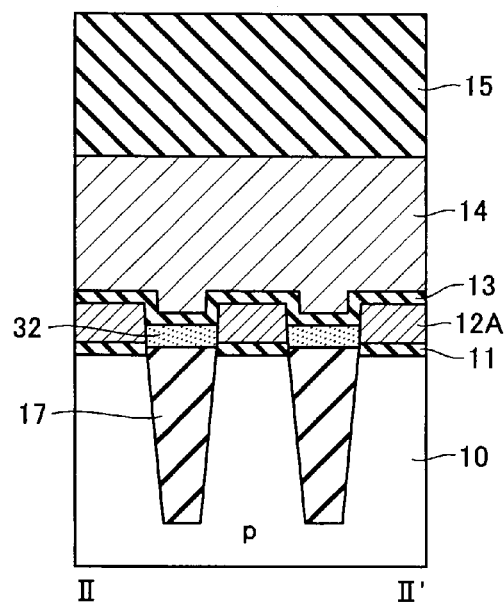
FIGS. 14A and 14B are cross-sectional views showing the NAND-type EEPROM in order of process step.
Figure 14B:
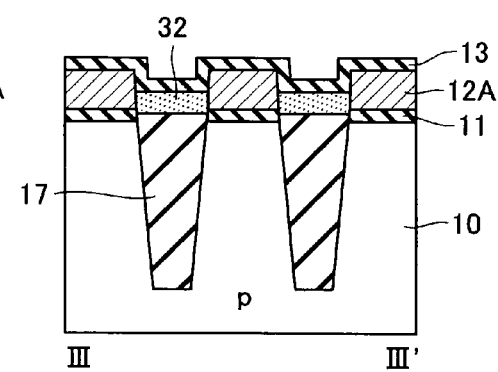

Subsequently, as shown in FIGS. 13 and 14, a resist film, not shown, is formed on the silicon nitride film 15 and patterned. Then, the silicon nitride film 15 and the second polysilicon film 14A are selectively removed by anisotropic etching to form the control gate 14.

Figure 15:
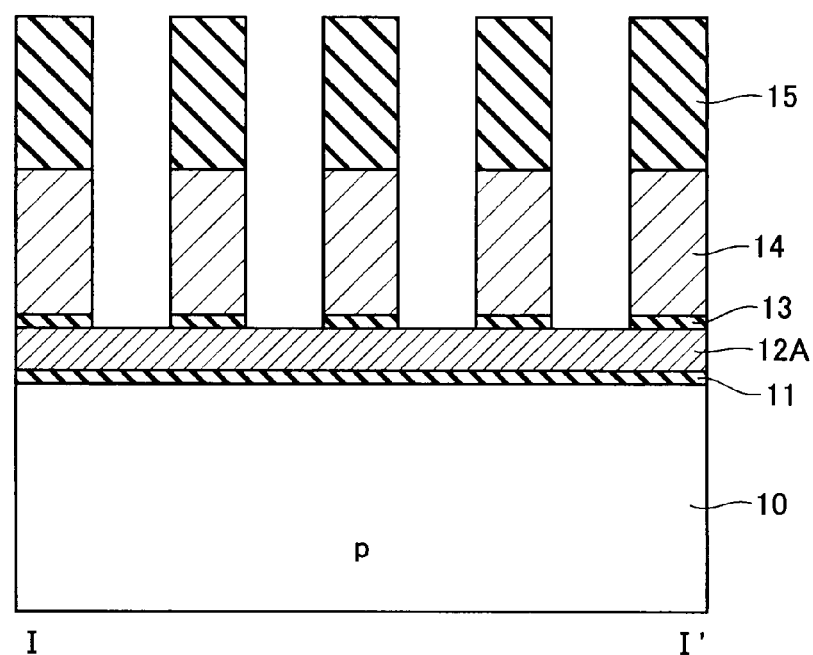
FIG. 15 is a cross-sectional view showing the NAND-type EEPROM in order of process step.
Figure 16A:
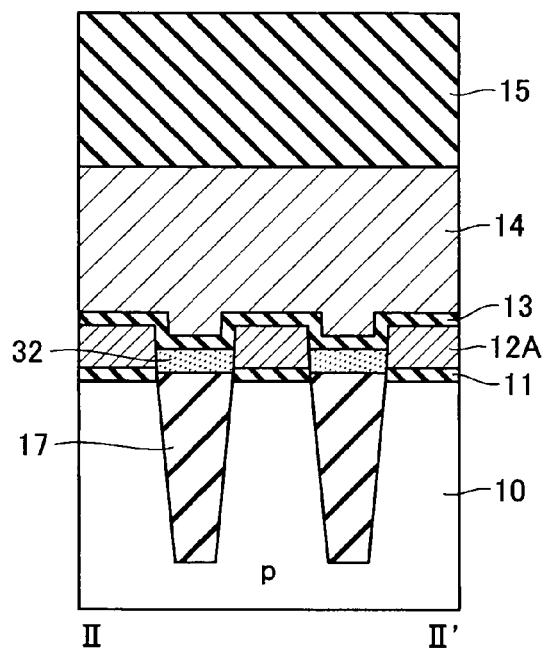
FIGS. 16A and 16B are cross-sectional views showing the NAND-type EEPROM in order of process step.
Figure 16B:
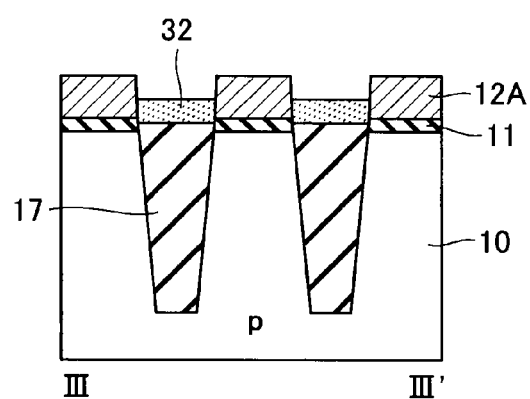

Next, as shown in FIGS. 15 and 16, after removal of the resist, the intergate insulating film 13 is selectively removed by anisotropic etching with a mask of the silicon nitride film 15. Thus, the air-gap creation film 32 is exposed through the region from which the intergate insulating film 13 is removed.

Figure 17:
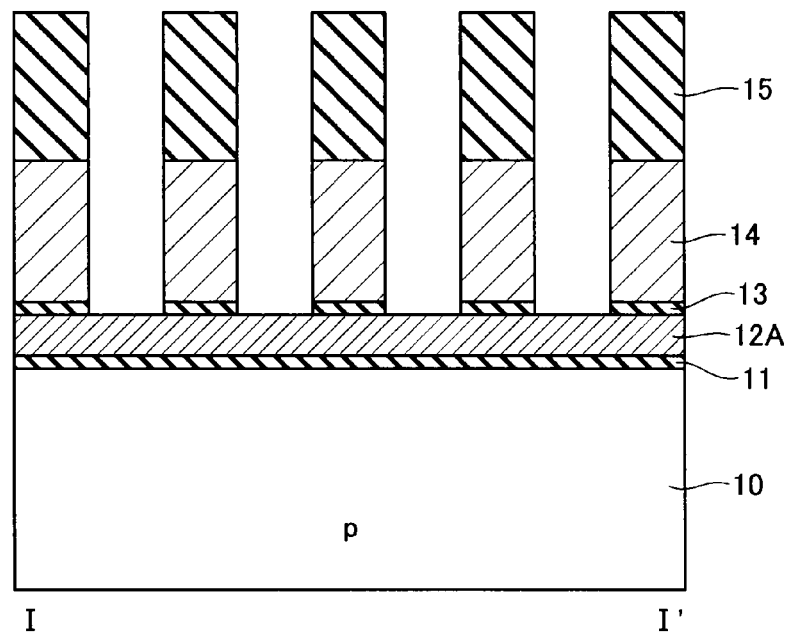
FIG. 17 is a cross-sectional view showing the NAND-type EEPROM in order of process step.
Figure 18A:
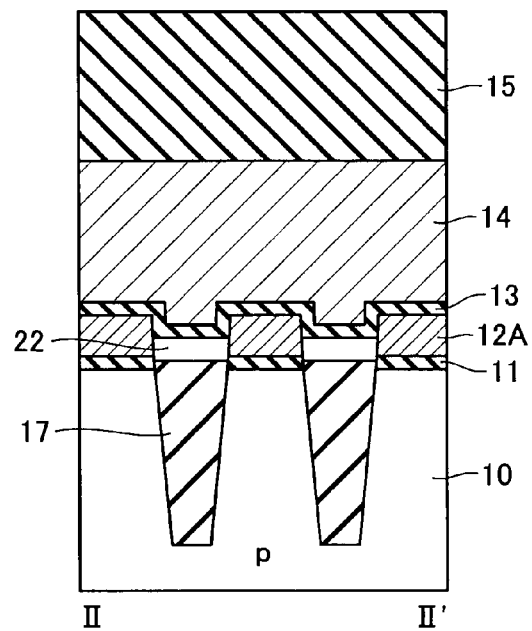
FIGS. 18A and 18B are cross-sectional views showing the NAND-type EEPROM in order of process step.
Figure 18B:
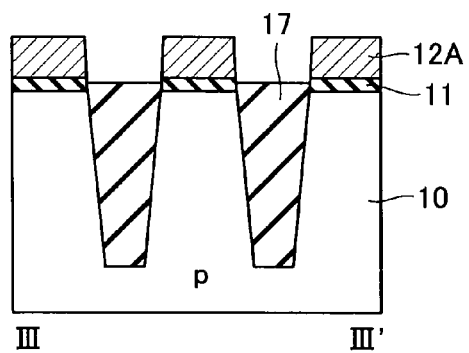

Then, as shown in FIGS. 17 and 18, a wet etching with DHF or the like is applied to selectively remove only the air-gap creation film 32 having a larger etching rate than the element isolation insulating film 17. As a result, as shown in FIG. 18, the surface of the element isolation insulating film 17 appears at a portion not immediately beneath the control gate 14 to form the air gap 22 at a portion immediately beneath the control gate 14 and located above the element isolation insulating film 17.

Figure 19:
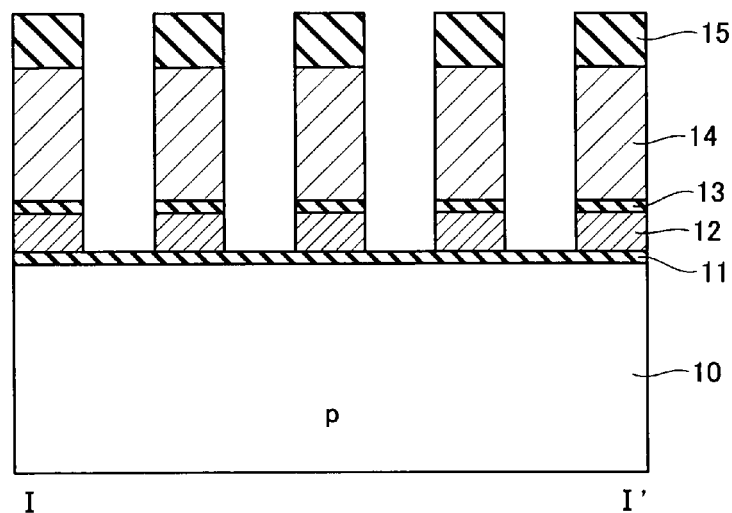
FIG. 19 is a cross-sectional view showing the NAND-type EEPROM in order of process step.
Figure 20A:
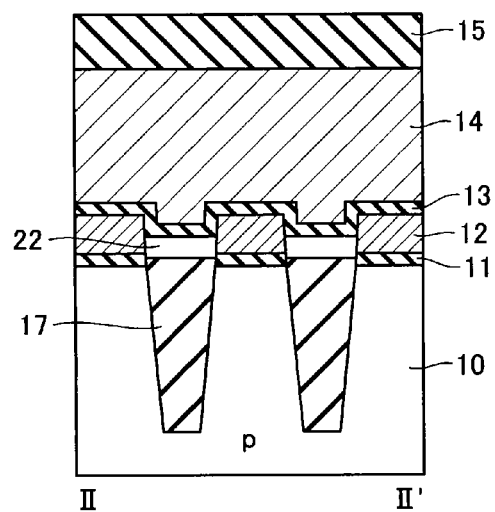
FIGS. 20A and 20B are cross-sectional views showing the NAND-type EEPROM in order of process step.
Figure 20B:
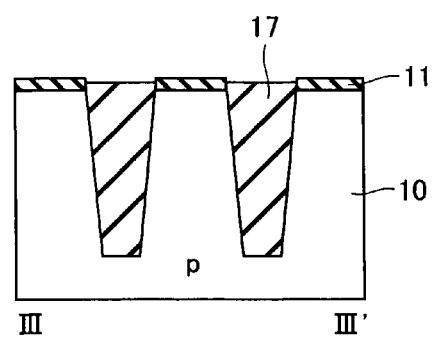

Thereafter, as shown in FIGS. 19 and 20, with a mask of the silicon nitride film 15, an anisotropic etching is applied to selectively remove the first polysilicon film 12A and divide it in the bit line BL direction to form the floating gates 12.

Figure 21:
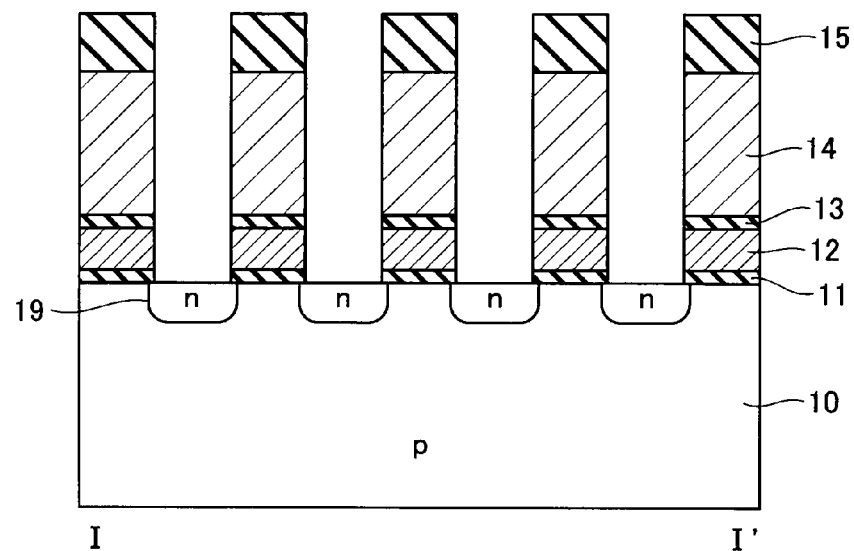
FIG. 21 is a cross-sectional view showing the NAND-type EEPROM in order of process step.
Figure 22A:
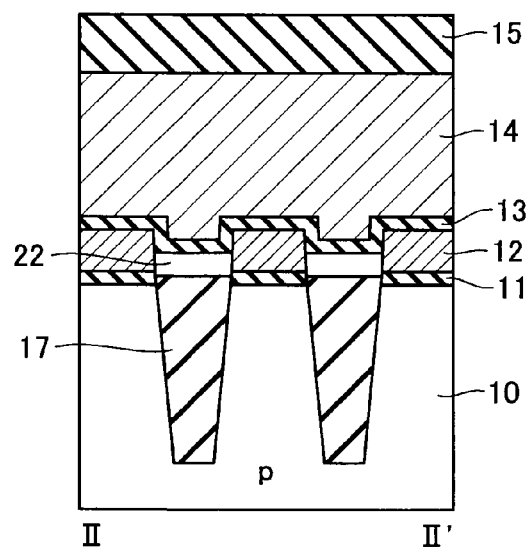
FIGS. 22A and 22B are cross-sectional views showing the NAND-type EEPROM in order of process step.
Figure 22B:
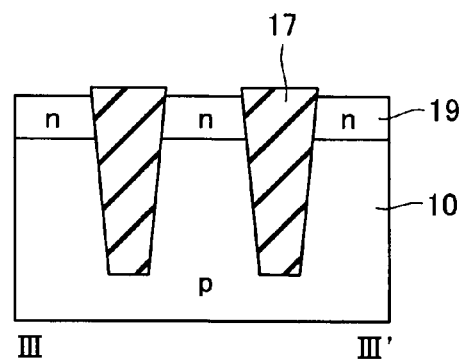

Further, as shown in FIGS. 21 and 22, with a mask of the silicon nitride film 15, an anisotropic etching is applied to selectively remove the gate oxide film 11, and selective ion implantation is executed to the silicon substrate 10 to form the impurity-diffused regions 19.

Figure 23:
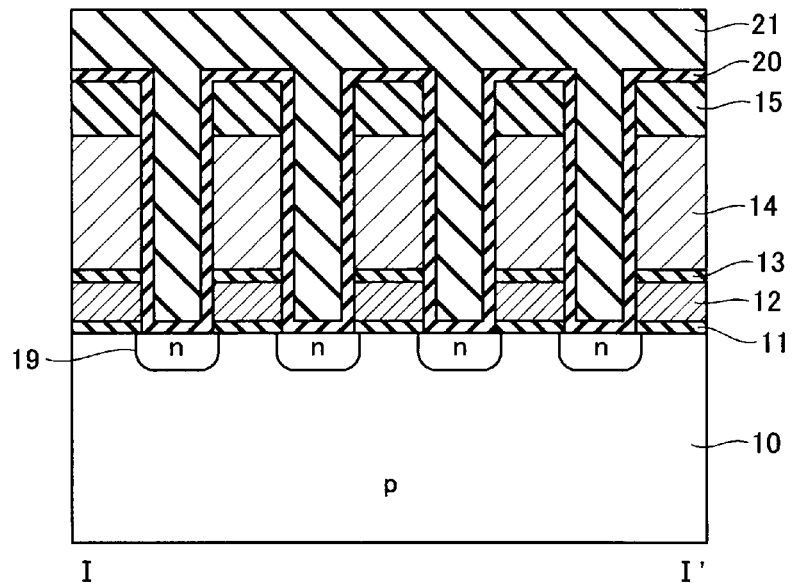
FIG. 23 is a cross-sectional view showing the NAND-type EEPROM in order of process step.
Figure 24A:
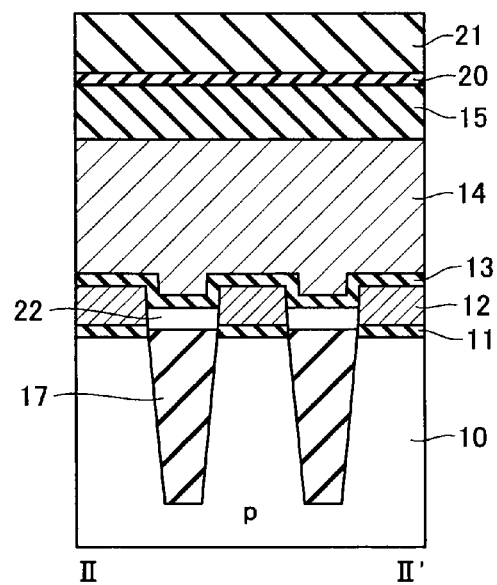
FIGS. 24A and 24B are cross-sectional views showing the NAND-type EEPROM in order of process step.
Figure 24B:
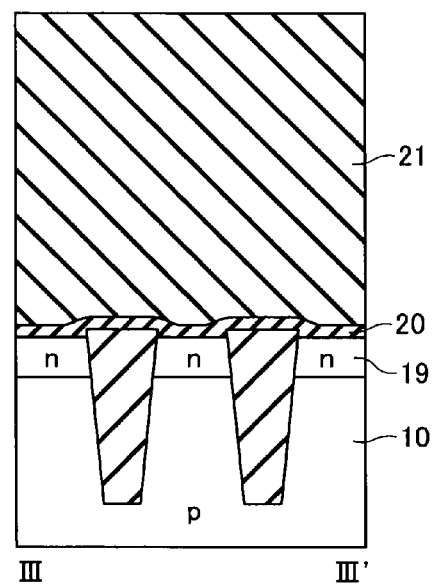

Subsequently, as shown in FIGS. 23 and 24, the silicon nitride film 20 is deposited with a thickness of around 5 nm over the entire surface and then the interlayer insulating film 21 such as TEOS is formed over the entire surface to fill spaces between electrodes. In this case, the air gap 22 retains a vacuum region because the sides in the bit line BL direction are closed with the interlayer insulating film 21. Thereafter, the bit lines BL and required contacts and so forth are formed to complete the EEPROM of the first embodiment.

The NAND-type EEPROM of the present embodiment thus manufactured can form the air gap 22 between the floating gates 12 adjoining in the word line WL direction. Accordingly, it is possible to reduce the capacitive coupling between memory cells to suppress the interference between floating gates.

The above manufacturing method can exert an effect as follows.

For example, as shown in FIG. 25, an NAND-type EEPROM of the prior art is not provided with the air gap 22. A method of manufacturing the EEPROM comprises applying an anisotropic etching to selectively remove a polysilicon film 12A other than that formed immediately beneath a control gate 14 to divide floating gates 12. At that time, as shown in FIG. 26, an element isolation insulating film 37 has reverse-tapered sides of a portion protruded above a gate oxide film 11. Accordingly, a part 12B of the polysilicon film remains on the sides and may possibly cause leakage between adjacent floating gates.

Figure 27:
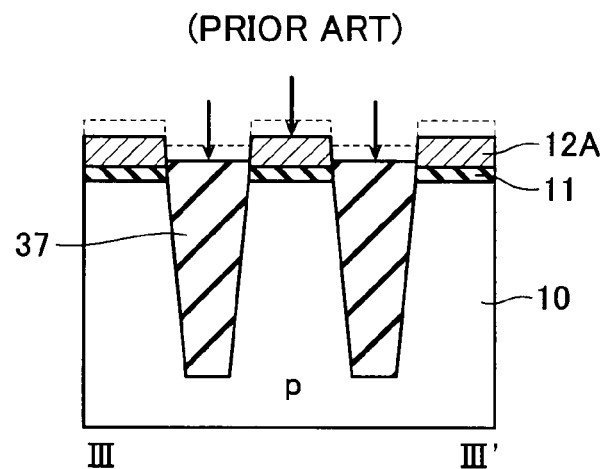
FIG. 27 is a cross-sectional view for illustrating the problem associated with the NAND-type EEPROM of the prior art.

To prevent such the malfunction, as shown in FIG. 27, the upper surface of the element isolation insulating film 37 is recessed back by etching as far as possible to reduce the height of the reverse-tapered portion, prior to formation of an intergate insulating film 13, as can be considered. Such the excessive recessed-back element isolation insulating film 37, however, results in a reduction in thickness of the polysilicon film 12A, which may cause damage to the substrate on processing the floating gates 12.

To the contrary, the method of manufacturing EEPROMs of the present embodiment uses the air-gap creation film 32 having a larger selection ratio relative to the element isolation insulating film 17. Therefore, it is possible to sufficiently recess back the upper surface of the element isolation insulating film 17 without causing a reduction in thickness of the floating gate 12 and damage to the substrate.

In this case, it is not required to etch off the air-gap creation film 32 immediately beneath the control gate 14. Rather, the effect can be exerted through etching to the extent sufficient to remove the air-gap creation film 32 other than that immediately beneath the control gate 14. In this case, at least part of the air-gap creation film 32 may remain immediately beneath the control gate 14.

It is desirable to locate the upper surface of the element isolation insulating film 17 at a position above the upper surface of the silicon substrate 10 and lower than a position t/3 higher than the lower surface of the floating gate 12 (more preferably, at a position 0-2 nm higher than the lower surface of the floating gate 12). If the upper surface of the element isolation insulating film 17 locates below the upper surface of the silicon substrate 10, the silicon substrate 10 on the side of the element isolation insulating film 17 is exposed and the silicon substrate 10 is damaged in the step of dividing the floating gate 12. If it is higher than the position t/3 higher than the lower surface of the floating gate 12, the remaining problem associated with the polysilicon film 12A described above becomes remarkable.

Second Embodiment Method of Manufacturing

Figure 28:
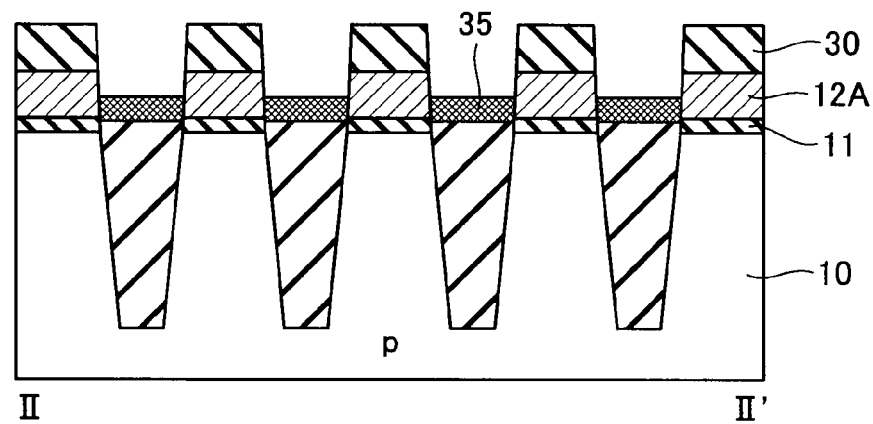
FIG. 28 is a cross-sectional view showing part of a process step of manufacturing an NAND-type EEPROM according to a second embodiment of the present invention.

FIG. 28 is a cross-sectional view of an NAND-type EEPROM according to another embodiment of the present invention taken along the word line WL in a process step.

In this embodiment, a process of CVD, for example, is applied to form an air-gap creation film 35 composed of a carbon-based material on the element isolation insulating film 17 in place of the air-gap creation film 32 of the polysilazan oxide or the like as shown in FIG. 9. Also in this case, the air-gap creation film 35 is formed over the entire surface. Then, it is polished by CMP with a stopper of the silicon nitride film 30, followed by a process of wet etching or RIE using DHF or the like to recess the air-gap creation film 35 back to a certain thickness.

The carbon-based air-gap creation film 35 can be removed by O2 ashing. Thus, the air-gap 22 can be formed in the portion where the carbon-based air-gap creation film 35 once existed.

What is claimed is:

1. A nonvolatile semiconductor memory device, comprising:
   a semiconductor substrate;
   an element isolation region disposed in the semiconductor substrate and configured to partition the semiconductor substrate into a plurality of element formation regions that are isolated from each other;
   a plurality of floating gates formed on the plurality of element formation regions via a first insulating film;
   a second insulating film formed extending on an upper surface and upper side surfaces of the plurality of floating gates and over the element isolation region;
   a control gate formed on the second insulating film; and
   an air gap formed between lower side surfaces of the plurality of floating gates and formed directly below and in contact with the second insulating film in the element isolation region.

2. The nonvolatile semiconductor memory device according to claim 1, wherein
   the air gap has a height of t/3 or more where t denotes a thickness of the floating gates.

3. The nonvolatile semiconductor memory device according to claim 1, wherein
   a buried insulating film is formed within the semiconductor substrate in the element isolation region.

4. The nonvolatile semiconductor memory device according to claim 3, wherein
   the air gap is formed between the buried insulating film and the second insulating film.

5. The nonvolatile semiconductor memory device according to claim 1, wherein
   the control gate is disposed between the upper side surfaces of the plurality of floating gates via the second insulating film.

6. A nonvolatile semiconductor memory device, comprising:
   a semiconductor substrate;
   an element isolation region disposed in the semiconductor substrate and configured to partition the semiconductor substrate into a plurality of element formation regions that are isolated from each other, a buried insulating film being formed within the semiconductor substrate in the element isolation region;
   a plurality of floating gates formed on the plurality of element formation regions via a first insulating film;
   a second insulating film formed extending on the plurality of floating gates and over the element isolation region;
   a control gate formed on the second insulating film; and
   an air gap formed between the plurality of floating gates in the element isolation region, the buried insulating film being formed below the air gap while not being formed above the air gap in the element isolation region.

7. The nonvolatile semiconductor memory device according to claim 6, wherein
   the air gap has a height of t/3 or more where t denotes a thickness of the floating gates.

8. The nonvolatile semiconductor memory device according to claim 6, wherein
   the air gap is formed directly below the second insulating film.

9. The nonvolatile semiconductor memory device according to claim 6, wherein
   the second insulating film is formed on an upper surface and upper side surfaces of the plurality of floating gates.

10. The nonvolatile semiconductor memory device according to claim 9, wherein
    the air gap is formed between lower side surfaces of the plurality of floating gates, and the control gate is disposed between the upper side surfaces of the plurality of floating gates via the second insulating film.

11. The nonvolatile semiconductor memory device according to claim 3, wherein the buried insulating film is formed below the air gap while not being formed above the air gap in the element isolation region.

* * * * *